United States Patent
Liu et al.

(10) Patent No.: US 8,491,863 B2
(45) Date of Patent: *Jul. 23, 2013

(54) METHOD FOR MAKING CARBON NANOTUBE ARRAY

(75) Inventors: Liang Liu, Beijing (CN); Kai-Li Jiang, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 32 days.

This patent is subject to a terminal disclaimer.

(21) Appl. No.: 13/071,524

(22) Filed: Mar. 25, 2011

(65) Prior Publication Data

US 2012/0076718 A1 Mar. 29, 2012

(30) Foreign Application Priority Data

Sep. 28, 2010 (CN) .......................... 2010 1 0294649

(51) Int. Cl.
*D01C 5/00* (2006.01)

(52) U.S. Cl.
USPC ...................................... 423/447.3; 977/842

(58) Field of Classification Search
USPC . 423/447.1, 447.3, 445 B, DIG. 40; 977/740, 977/742, 840
See application file for complete search history.

(56) References Cited

U.S. PATENT DOCUMENTS 7,029,751 B2 4/2006 Fan et al.
2008/0159946 A1* 7/2008 Chen et al. ................. 423/447.3

OTHER PUBLICATIONS

Fan, S. et al. "Monitoring the growth of carbon nanotubes by carbon isotope labelling." Nanotechnology 14 (2003) 1118-1123.*

* cited by examiner

*Primary Examiner* — Stanley Silverman
*Assistant Examiner* — Richard M Rump
(74) *Attorney, Agent, or Firm* — Altis Law Group, Inc.

(57) ABSTRACT

A method for forming a carbon nanotube array is related. A substrate with a catalyst layer on a surface of the substrate is provided and placed into a reaction device. At least two kinds of carbon source gases including different kinds of single carbon isotope are introduced into the reaction device at the same time. The reaction device is heated to different reaction temperatures to react the carbon source gases under different temperatures to grow a carbon nanotube array on a surface of the catalyst layer.

20 Claims, 12 Drawing Sheets

METHOD FOR MAKING CARBON NANOTUBE ARRAY

CROSS-REFERENCE TO RELATED APPLICATIONS

This application claims all benefits accruing under 35 U.S.C. §119 from China Patent Application No. 201010294649.0, filed on Sep. 28, 2010 in the China Intellectual Property Office, the disclosure of which is incorporated herein by reference. This application is related to applications entitled, "CARBON NANOTUBE ARRAY AND METHOD FOR MAKING SAME", filed Mar. 25, 2011 Ser. No. 13/071,525.

BACKGROUND

1. Technical Field

The present disclosure relates to a method for making carbon nanotube arrays, and particularly to a method for making an isotope-doped carbon nanotube arrays.

2. Discussion of Related Art

Isotope labeling is a powerful tool in the study of nanomaterial growth mechanisms and in nano-sized isotope junction synthesis. Methods of isotope labeling use reactants containing different isotopes of a special element (usually light elements such as carbon, boron, nitrogen and oxygen), which are fed in designated concentrations (pure or mixed) and sequences into a nano-material synthesis process to provide in situ isotope labeling of nano-materials.

A typical example is shown and discussed in U.S. Pat. No. 7,029,751B2, entitled, "ISOTOPE-DOPED CARBON NANOTUBE AND METHOD AND APPARATUS FOR FORMING THE SAME," issued to Fan, et al., on Apr. 18, 2006.

However, the method for making the isotope-doped carbon nanotube disclosed in Fan et al., need introduce different kinds of carbon source gas in a switch manner, which is complicated.

What is needed, therefore, is to provide a method for making the isotope-doped carbon nanotubes, to overcome the above-described shortcomings.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
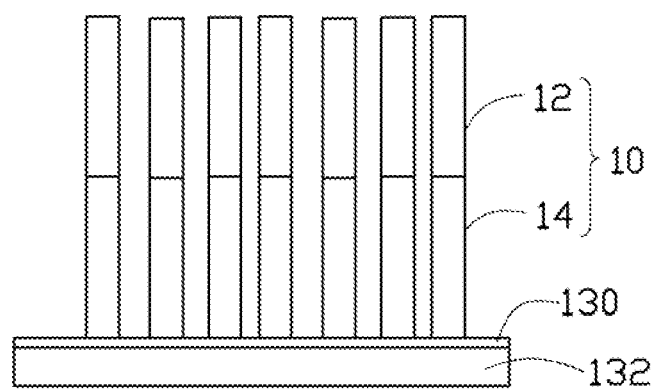
FIG. 1 shows a schematic view of one embodiment of a carbon nanotube array.

Referring to FIG. 1, a carbon nanotube array 10 is disclosed. The carbon nanotube array 10 can be formed on a catalyst layer 130 of a substrate 132. The carbon nanotube array 10 is an isotope-doped carbon nanotube array having a plurality of isotope-doped carbon nanotubes. Each isotope-doped carbon nanotube includes a first carbon nanotube segment 12 and a second carbon nanotube segment 14. The second carbon nanotube segment 14 is formed on the catalyst layer 130 of the substrate 132. The first carbon nanotube segment 12 is formed on the top of the second carbon nanotube segment 14. The first carbon nanotube segments 12 can consist essentially of carbon-12 isotope. The second carbon nanotube segments 14 can consist essentially of carbon-12 isotope and carbon-13 isotope. The carbon-12 isotope and carbon-13 isotope in the second carbon nanotube segment 14 are mixed uniformly in any proportion. Alternatively, the first carbon nanotube segment 12 can consist essentially of carbon-12 isotope and carbon-13 isotope, and the second carbon nanotube segment 14 can consist essentially of carbon-12 isotope.

The isotope-doped carbon nanotubes in the carbon nanotube array 10 can be single-walled carbon nanotubes, double-walled carbon nanotubes, multi-walled carbon nanotubes, or combinations thereof. A diameter of the isotope-doped carbon nanotubes can be in a range from about 0.5 nanometers to about 50 nanometers. A height of the isotope-doped carbon nanotubes can be in a range from about 50 nanometers to about 5 millimeters. The first carbon nanotube segments 12 and the second carbon nanotube segments 14 can have a substantially same height.

Figure 2:
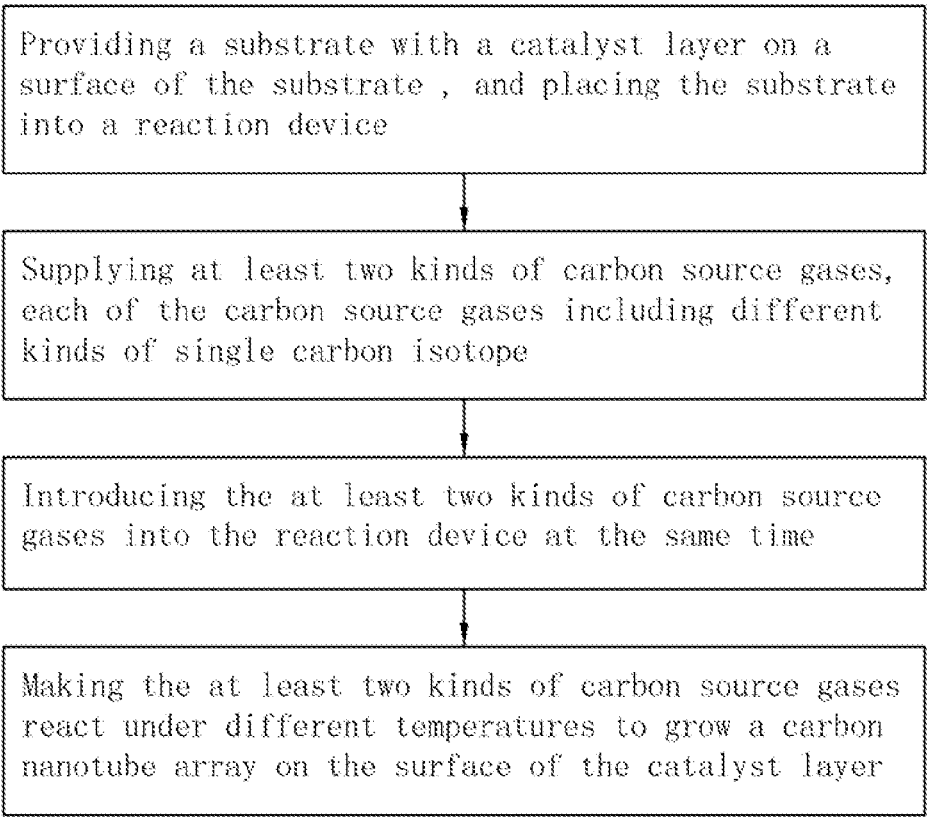
FIG. 2 shows a flow chart of one embodiment of a method to form the carbon nanotube array of FIG. 1.
Figure 3:
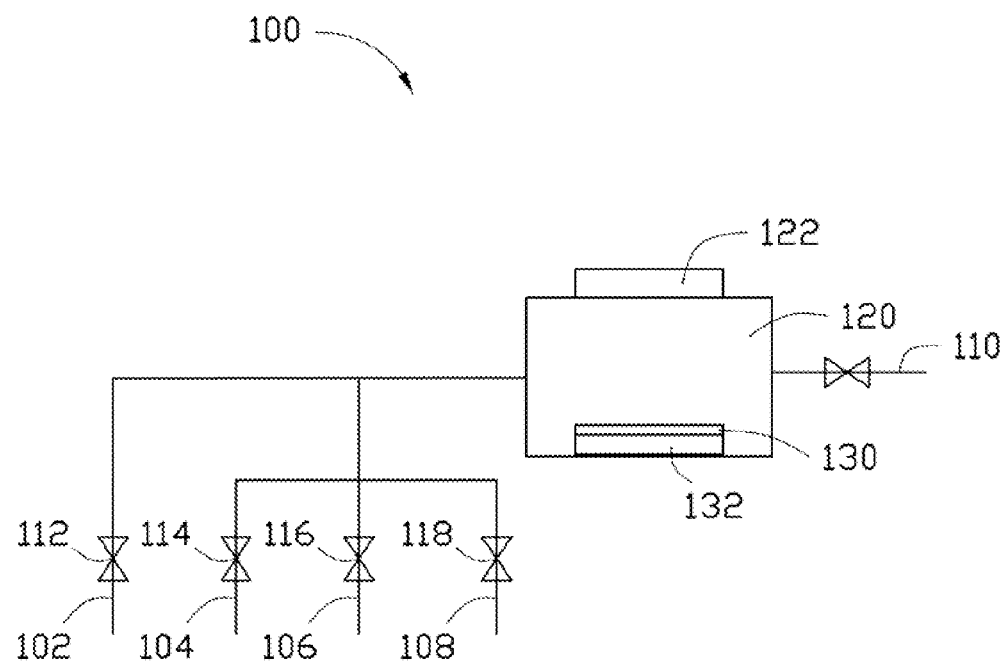
FIG. 3 shows a schematic diagram of one embodiment of an apparatus used to form the carbon nanotube array of FIG. 1.

Referring to FIG. 2 and FIG. 3, the carbon nanotube array 10 can be made by the following steps:

(S10) providing a substrate 132 with a catalyst layer 130 on a surface of the substrate 132, and placing the substrate 132 into a reaction device 100;

(S11) supplying at least two kinds of carbon source gases, each of the carbon source gases including different kinds of single carbon isotope;

(S12) introducing the at least two kinds of carbon source gases into the reaction device 100 simultaneously; and (S13) reacting the at least two kinds of carbon source gases under different temperatures to grow the carbon nanotube array 10 on a surface of the catalyst layer 130.

In step (S10), the substrate 132 is a polished silicon sheet. A smoothness of the surface of the substrate 132 is less than 10 nanometers. Alternatively, the substrate 132 can also be a polished silicon dioxide sheet or a polished quartz sheet.

The catalyst layer 130 can be an iron film. The thickness of the iron film can be in a range from about 3 nanometers to about 6 nanometers. The iron film can be uniformly disposed on the surface of the substrate 132 by means of chemical vapor deposition, thermal deposition, electron-beam deposition, or sputtering. The material of the catalyst layer 130 can also be a transition metal such as copper, cobalt, nickel, or any alloy thereof.

The reaction device 100 includes a reaction chamber 120, a reaction furnace 122 for heating the reaction chamber 120, a protective gas supply conduit 102, three carbon source gas supply pipes 104, 106, 108, and a vent-pipe 110. The protective gas supply conduit 102 is controlled by a valve 112. The carbon source gas supply pipe 104 is controlled by a valve 114. The carbon source gas supply pipe 106 is controlled by a valve 116. The carbon source gas supply pipe 108 is controlled by a valve 118.

The substrate 132 with the catalyst layer 130 is placed into the reaction chamber 120. When the substrate 132 is placed into the reaction chamber 120, an angle between the catalyst layer 130 and the horizontal direction will be formed. In one embodiment, the angle is about 0 degrees. In addition, the catalyst layer 130 in the reaction chamber 120 can be heated to a predetermined temperature by the reaction furnace 122.

In step (S11), the at least two kinds of carbon source gases can be supplied by the three carbon source gas supply pipes 104, 106, and 108. The at least two kinds of carbon source gases can be methane, acetylene, ethylene, allene, or other hydrocarbons. Each kind of carbon source gas includes a single kind of carbon isotope, for example, carbon-12 isotope, carbon-13 isotope, or carbon-14 isotope. In one embodiment, the at least two kinds of carbon source gases are the acetylene including a single carbon-12 isotope and the ethylene including a single carbon-13 isotope.

Step (S12) includes the steps of:

(S121), evacuating the reaction chamber 120 by the vent-pipe 110;

(S122), introducing a protective gas under a pressure of 1 atmosphere into the reaction chamber 120 through the protective gas supply conduit 112; and (S123), introducing the at least two kinds of carbon source gases into the reaction chamber 120 simultaneously.

The protective gas can be argon, nitrogen, helium, or neon. After the protective gas is introduced into the reaction chamber 120, the acetylene including a single carbon-12 isotope and the ethylene including a single carbon-13 isotope are introduced into the reaction chamber 120 simultaneously. The acetylene is introduced into the reaction chamber 120 through the carbon source gas supply pipe 114 at a flow rate of about 120 standard cubic centimeters per minute (sccm). The ethylene is introduced into the reaction chamber 120 through the carbon source gas supply pipe 116 at a flow rate of about 120 sccm.

In step (S13), the reaction chamber 120 and the catalyst layer 130 therein are heated to a first temperature via a heating device (not shown) in the reaction furnace 122. The first temperature can be in a range from about 600° C. to about 650° C. Because the first temperature only reaches the decomposition temperature of acetylene but does not reach the decomposition temperature of ethylene, the acetylene including a single carbon-12 isotope will decompose individually, to grow the first carbon nanotube segment 12 having carbon-12 isotope on the surface of the catalyst layer 130.

After a first given time for growing the first carbon nanotube segment 12, the reaction chamber 120 and the catalyst layer 130 therein are heated to a second temperature by the heating device in the reaction furnace 122. The second temperature can be in a range from about 650° C. to about 800° C. Because the growth points of the carbon nanotubes are at the catalyst layer 130 and the second temperature reaches the decomposition temperature of both acetylene and ethylene, the acetylene and ethylene will decompose simultaneously, to continuously grow the second carbon nanotube segment 14 having carbon-12 isotope and carbon-13 isotope at the bottom of the first carbon nanotube segment 12. The carbon-12 isotope and carbon-13 isotope in the second carbon nanotube segments 14 are mixed uniformly in any proportion. After a second given time for growing the second carbon nanotube segment 14, the carbon nanotube array 10 is formed on the surface of the catalyst layer 130.

Alternatively, in step (S13), the reaction chamber 120 and the catalyst layer 130 therein can be first heated to a first temperature in a range from about 650° C. to about 800° C. Because the first temperature reaches the decomposition temperature of acetylene and ethylene, the acetylene and ethylene will decompose simultaneously, to grow the first carbon nanotube segment 12 having carbon-12 isotope and carbon-13 isotope on the surface of the catalyst layer 130. After a first given time for growing the first carbon nanotube segment 12, the reaction chamber 120 and the catalyst layer 130 therein can be cooled down to a second temperature in a range from about 600° C. to about 650° C. Because the second temperature only reaches the decomposition temperature of acetylene, the acetylene will decompose individually, to grow the second carbon nanotube segment 14 having carbon-12 isotope at the bottom of the first carbon nanotube segment 12. Furthermore, the above steps can be repeated to grow first carbon nanotube segments 12 and second carbon nanotube segments 14 alternately arranged along the longitudinal direction of isotope-doped carbon nanotube.

Figure 4:
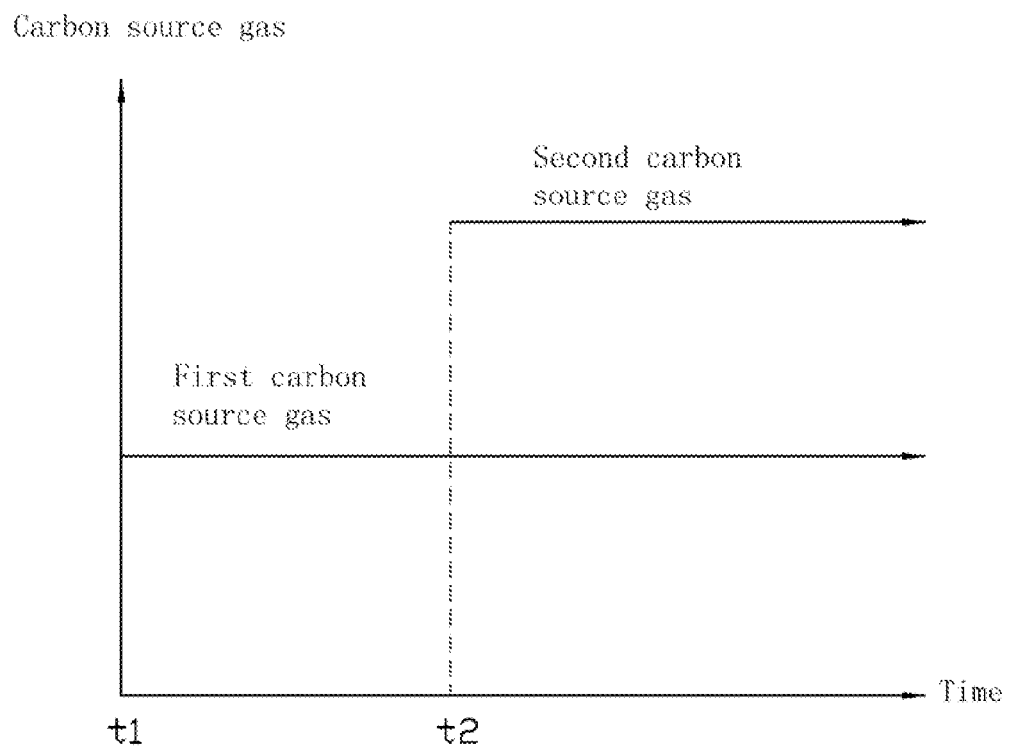
FIG. 4 shows a schematic diagram of one embodiment of introducing the carbon source gases into the apparatus of FIG. 3.

Referring to FIG. 3 and FIG. 4, in another embodiment, the carbon nanotube array 10 can be made by the following steps:

(S10a) providing a substrate 132 with a catalyst layer 130 on a surface of the substrate 132, and placing the substrate 132 into a reaction device 100;

(S11a) controlling the reaction device 100 at a reaction temperature;

(S12a) introducing a first carbon source gas into the reaction device 100 to grow a first carbon nanotube segment 12, wherein the first carbon source gas includes a single carbon isotope; and (S13a) introducing a second carbon source gas with the first carbon source gas into the reaction device 100 to grow a second carbon nanotube segment 14 at the bottom of the first carbon nanotube segment 12, wherein the second carbon source gas includes a single carbon isotope different from the carbon isotope of the first carbon source gas.

In step (S11a), the reaction temperature can be in a range from about 650° C. to about 800° C.

In step (S12a) and (S13a), the first carbon source gas is acetylene including a single carbon-12 isotope, and the second carbon source gas is ethylene including a single carbon-13 isotope.

Figure 5:
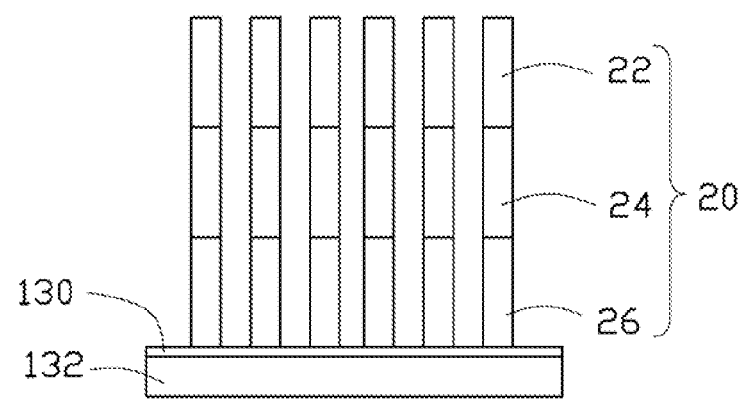
FIG. 5 shows a schematic view of one embodiment of a carbon nanotube array.

Referring to FIG. 5, a carbon nanotube array 20 is disclosed. The carbon nanotube array 20 can be formed on a catalyst layer 130 of the substrate 132. The carbon nanotube array 20 is an isotope-doped carbon nanotube array having a plurality of isotope-doped carbon nanotubes. The isotope-doped carbon nanotubes include a first carbon nanotube segment 22, a second carbon nanotube segment 24, and a third carbon nanotube segment 26. The third carbon nanotube segment 26 is formed on the catalyst layer 130 of the substrate 132. The second carbon nanotube segment 24 is formed on the top of third carbon nanotube segment 26. The first carbon nanotube segment 22 is formed on the top of second carbon nanotube segment 24. The first carbon nanotube segments 22 can consist essentially of carbon-12 isotopes. The second carbon nanotube segments 24 can consist essentially of carbon-12 isotope and carbon-13 isotopes. The third carbon nanotube segments 26 can consist essentially of carbon-12 isotopes, carbon-13 isotopes, and carbon-14 isotopes. The carbon-12 isotopes and carbon-13 isotopes in the second carbon nanotube segments 24 are mixed uniformly in any proportion. The carbon-12 isotopes, carbon-13 isotopes, and carbon-14 isotopes in the third carbon nanotube segments 26 are also mixed uniformly in any proportion.

Figure 6:
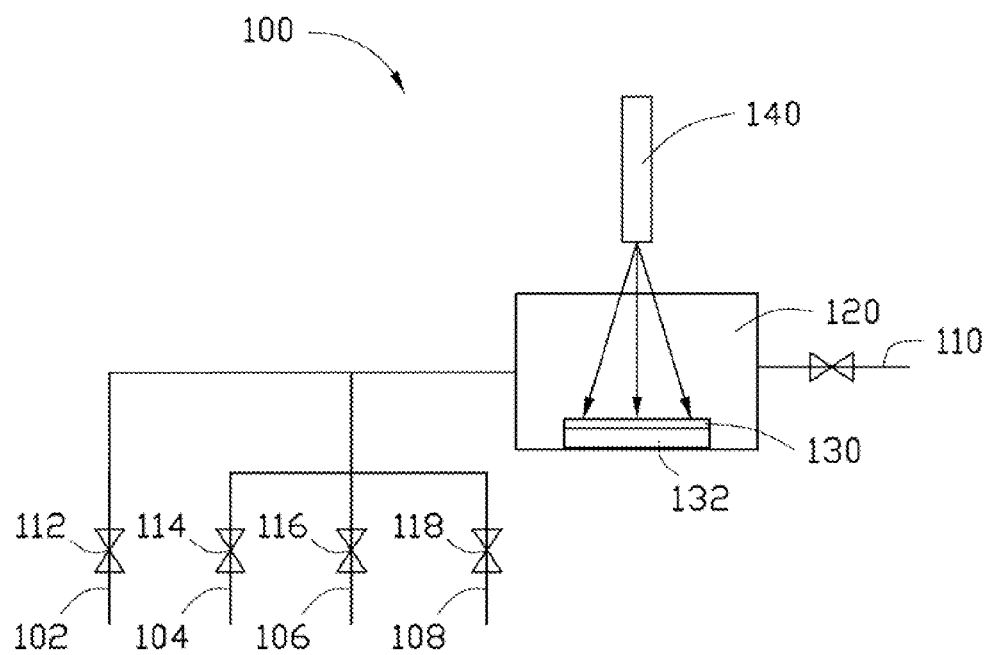
FIG. 6 shows a schematic diagram of one embodiment of an apparatus used to form the carbon nanotube array of FIG. 5.

Referring to FIG. 6, the carbon nanotube array 20 can be made by the following steps:

(S20) providing a substrate 132 with a catalyst layer 130 on a surface of the substrate 132, and placing the substrate 132 into a reaction device 100;

(S21) supplying three kinds of carbon source gases, each of the carbon source gases including different kinds of single carbon isotope;

(S22) introducing the three kinds of carbon source gases into the reaction device 100 simultaneously; and (S23) reacting the three kinds of carbon source gases react under different temperatures, to grow the carbon nanotube array 20 on a surface of the catalyst layer 130.

In step (20), the reaction device 100 includes a reaction chamber 120, and a laser heating device 140 for heating the reaction chamber 120 and the catalyst layer 130 therein.

The step (S21) and step (S22) are substantially the same as the step (S11) and step (S12), the difference is that the carbon source gases include three kinds of carbon source gases. The three kinds of carbon source gases are methane, acetylene, and ethylene. The methane includes a single carbon-14 isotope, the ethylene includes a single carbon-13 isotope, and the acetylene includes a single carbon-12 isotope. The three kinds of carbon source gases are introduced into the reaction chamber 120 simultaneously, and the methane is introduced into the reaction chamber 120 through the carbon source gas supply pipe 118 at a flow rate of about 120 sccm.

In step (S23), the reaction chamber 120 and the catalyst layer 130 are heated to a first temperature by the laser heating device 140. The first temperature can be in a range from about 600° C. to about 650° C. Because the first temperature only reaches the decomposition temperature of acetylene but does not reach the decomposition temperature of ethylene and methane, the acetylene including a single carbon-12 isotope will decompose individually, thus the first carbon nanotube segment 22 having carbon-12 isotope will form on the surface of the catalyst layer 130. After a first given time for growing the first carbon nanotube segment 22, the reaction chamber 120 and the catalyst layer 130 are heated to a second temperature in a range from about 650° C. to about 800° C. Because the second temperature reaches the decomposition temperature of acetylene and ethylene but does not reach the decomposition temperature of methane, the acetylene and ethylene will decompose together, thus the second carbon nanotube segment 24 having carbon-12 isotope and carbon-13 isotope will form at the bottom of the first carbon nanotube segment 22. After a second given time for growing the second carbon nanotube segment 24, the reaction chamber 120 and the catalyst layer 130 are heated to a third temperature in a range from about 850° C. to about 1100° C. Because the third temperature reaches the decomposition temperature of acetylene, ethylene, and methane, the acetylene, ethylene, and methane will decompose together, thus the third carbon nanotube segment 26 having carbon-12 isotope, carbon-13 isotope, and carbon-13 isotope will form at the bottom of the second carbon nanotube segment 24. After a third given time for growing the third carbon nanotube segment 26, the carbon nanotube array 20 is formed on the surface of the catalyst layer 130. Furthermore, the above steps can be repeated to grow the first, second, and third carbon nanotube segment 22, 24, and 26 alternately arranged along the longitudinal direction of the isotope-doped carbon nanotube.

Alternatively, in step (S23), the temperature of the reaction chamber 120 and the catalyst layer 130 therein can be controlled by the laser heating device 140 to achieve different temperatures successively, and then growing different kinds of carbon nanotube arrays.

Figure 7:
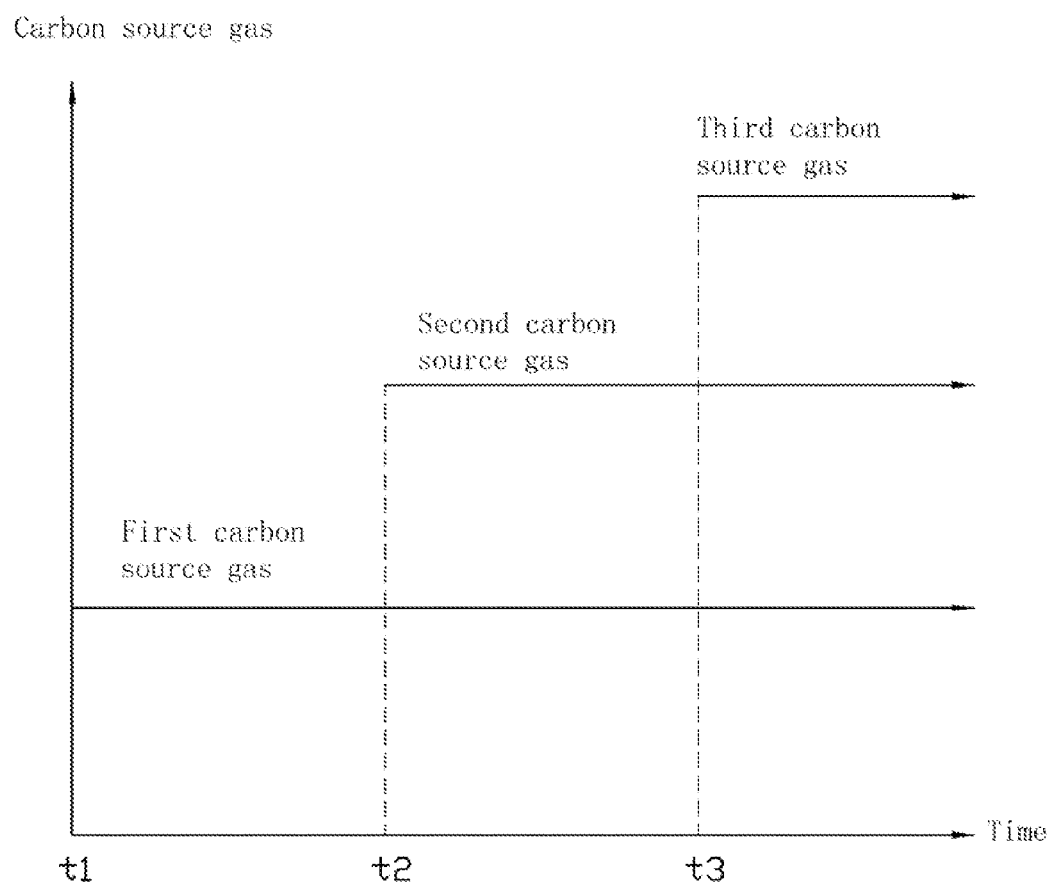
FIG. 7 shows a schematic diagram of one embodiment of introducing the carbon source gases into the apparatus of FIG. 6.

Referring to FIG. 6 and FIG. 7, in another embodiment, the carbon nanotube array 20 of FIG. 5 can be made by the following steps:

(S20a) providing a substrate 132 with a catalyst layer 130 on a surface of the substrate 132, and placing the substrate 132 into a reaction device 100;

(S21a) controlling the reaction device 100 to a reaction temperature;

(S22a) introducing a first carbon source gas into the reaction device 100 to grow a first carbon nanotube segment 22, wherein the first carbon source gas includes a single carbon isotope;

(S23a) keeping introducing the first carbon source gas and introducing a second carbon source gas into the reaction device 100 to grow a second carbon nanotube segment 24 at the bottom of the first carbon nanotube segment 22, wherein the second carbon source gas includes a single carbon isotope different from the carbon isotope of the first carbon source gas; and (S24a) keeping introducing the first carbon source gas and the second carbon source gas, and further introducing a third carbon source gas into the reaction device 100 to grow a third carbon nanotube segment 26 at the bottom of the second carbon nanotube segment 24, wherein the third carbon source gas includes a single carbon isotope different from the carbon isotope of the first carbon source gas and the second carbon source gas.

In step (S21a), the reaction temperature can be in a range from about 850° C. to about 1100° C.

In step (22a), (S23a) and (S24a), the first carbon source gas is acetylene including a single carbon-12 isotope, the second carbon source gas is ethylene including a single carbon-13 isotope, and the third carbon source gas is methane including a single carbon-14 isotope.

Figure 8:
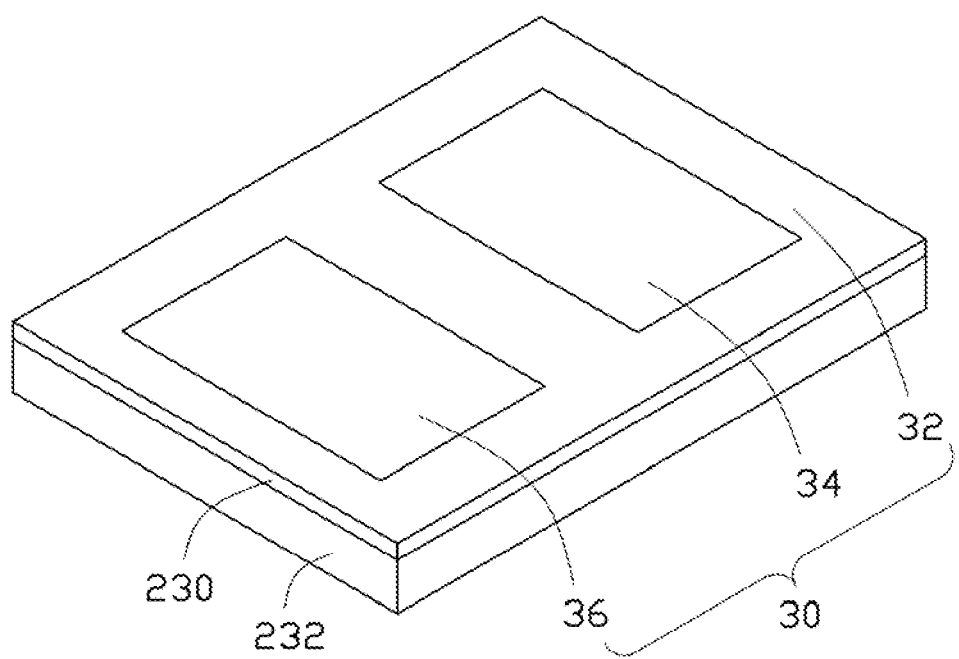
FIG. 8 shows one embodiment of a carbon nanotube array.

Referring to FIG. 8, a carbon nanotube array 30 is disclosed. The carbon nanotube array 30 can be formed on a catalyst layer 230 of the substrate 232. The carbon nanotube array 30 is an isotope-doped carbon nanotube array including a first isotope-doped carbon nanotube sub-array 32, a second isotope-doped carbon nanotube sub-array 34, and a third isotope-doped carbon nanotube sub-array 36. Each isotope-doped carbon nanotube sub-array includes a plurality of carbon nanotubes. Each carbon nanotube in each isotope-doped carbon nanotube sub-array is made up of a single carbon nanotube segment. The carbon nanotubes in the first isotope-doped carbon nanotube sub-array 32 are composed of carbon-12 isotope. The carbon nanotubes in the second isotope-doped carbon nanotube sub-array 34 are composed of carbon-12 isotope and carbon-13 isotope. The carbon nanotubes in the third isotope-doped carbon nanotube sub-array 36 are composed of carbon-12 isotope, carbon-13 isotope, and carbon-14 isotope. The carbon-12 isotope and carbon-13 isotope in the carbon nanotubes of second isotope-doped carbon nanotube sub-array 34 are mixed uniformly in any proportion. The carbon-12 isotope, carbon-13 isotope, and carbon-14 isotope in the carbon nanotubes of third isotope-doped carbon nanotube sub-array 36 are also mixed uniformly in any proportion.

The second isotope-doped carbon nanotube sub-array 34 and third isotope-doped carbon nanotube sub-array 36 can have the same shape and size. In one embodiment, the shape of each of the second and third isotope-doped carbon nanotube sub-arrays 34 and 36 is rectangular. The second isotope-doped carbon nanotube sub-array 34 and the third isotope-doped carbon nanotube sub-array 36 are formed on the surface of the substrate, and spaced from each other. Both of the second isotope-doped carbon nanotube sub-array 34 and the third isotope-doped carbon nanotube sub-array 36 are surrounded by the first isotope-doped carbon nanotube sub-array 32. Alternatively, the shape and size of the second isotope-doped carbon nanotube sub-array 34 and the third isotope-doped carbon nanotube sub-array 36 can be controlled according to actual demand.

The carbon nanotubes in the carbon nanotube array 30 can be single-walled carbon nanotubes, double-walled carbon nanotubes, multi-walled carbon nanotubes, or combinations thereof. The diameter of the carbon nanotubes can be in a range from about 0.5 nanometers to about 50 nanometers. The height of the carbon nanotubes can be in a range from about 50 nanometers to about 5 millimeters.

Figure 9:
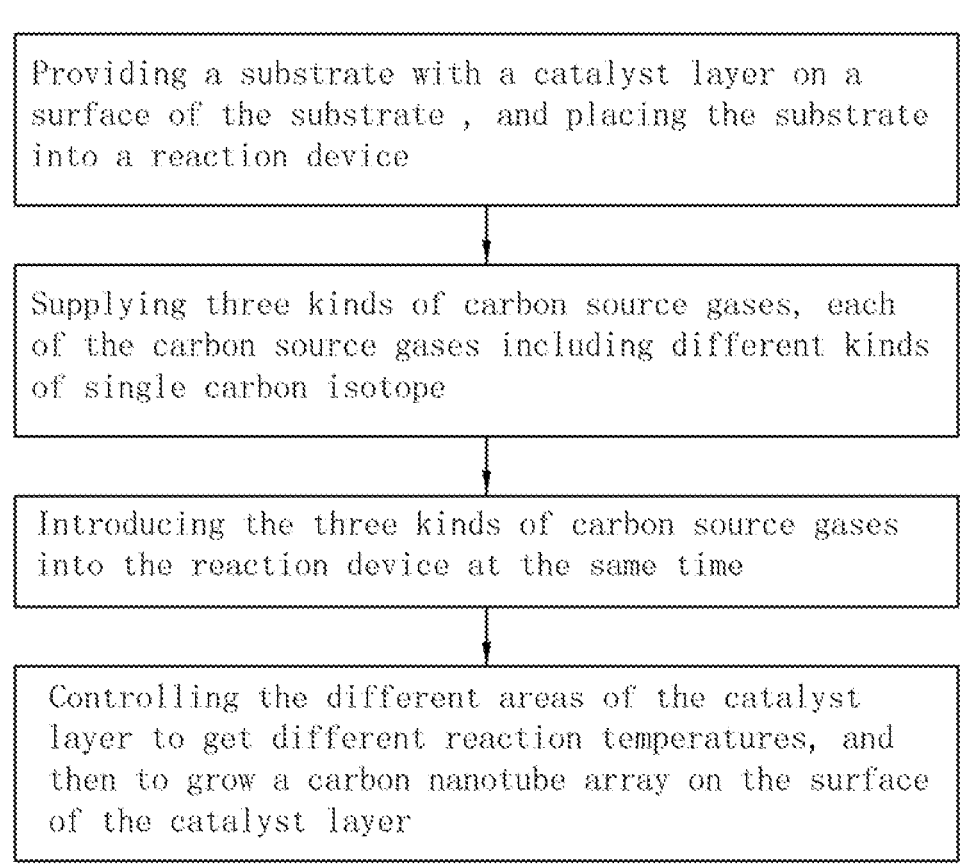
FIG. 9 shows a flow chart of one embodiment of a method to form the carbon nanotube array of FIG. 8.
Figure 10:
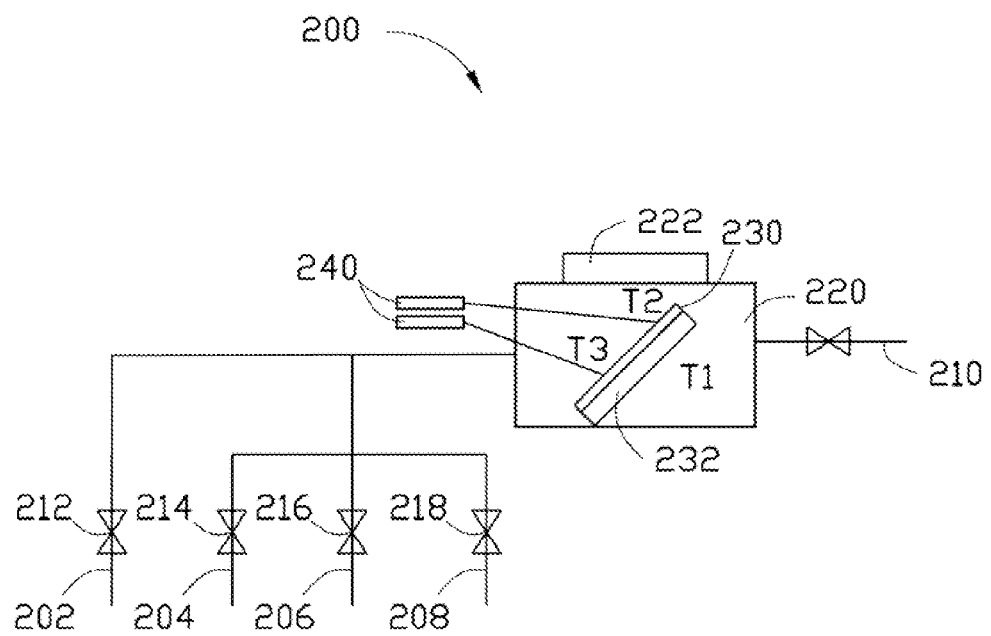
FIG. 10 shows a schematic diagram of one embodiment of an apparatus used to form the carbon nanotube array of FIG. 8.

Referring to FIG. 9 and FIG. 10, the carbon nanotube array 30 can be made by the following steps:

(S30) providing a substrate 232 with a catalyst layer 230 on a surface of the substrate 232, and placing the substrate 232 into a reaction device 200;

(S31) supplying three kinds of carbon source gases, each of the carbon source gases including different kinds of single carbon isotope;

(S32) introducing the three kinds of carbon source gases into the reaction device 200 simultaneously; and (S33) controlling the different areas of the catalyst layer 230 to achieve different reaction temperatures to grow the carbon nanotube array 30 on a surface of the catalyst layer 230.

In step (S30), the substrate 232 and the catalyst 230 are the same as the substrate 132 and the catalyst 130, respectively. The reaction device 200 includes a reaction chamber 220, a reaction furnace 222 and two laser heating devices 240 for heating the reaction chamber 220 and the catalyst layer 230, a protective gas supply conduit 202, three carbon source gas supply pipes 204, 206, 208, and a vent-pipe 210. The protective gas supply conduit 202 is controlled by a valve 212. The carbon source gas supply pipe 204 is controlled by a valve 214. The carbon source gas supply pipe 206 is controlled by a valve 216. The carbon source gas supply pipe 208 is controlled by a valve 218.

The substrate 232 with the catalyst layer 230 is obliquely placed into the reaction chamber 220 of the reaction device 200 such that the substrate 232 is obliquely oriented relative to the horizontal direction and the carbon source gases has less of a distance to reach the substrate 232. An angle between the substrate 232 and the horizontal direction is about 45°, to improve the growth uniformity of the carbon nanotube array 30. When the substrate 232 with the catalyst layer 230 is placed into the reaction chamber 220, the whole catalyst layer 230 can be heated to a predetermined temperature. The two laser heating devices 240 can irradiate the two partial areas of the catalyst layer 230 and allow the two partial areas of the catalyst layer 230 to achieve higher temperatures.

In step (S31) and step (S32), the three kinds of carbon source gases are provided and introduced into the reaction chamber 220 simultaneously. The three kinds of carbon source gases are methane including a single carbon-14 isotope, ethylene including a single carbon-13 isotope, and acetylene including a single carbon-12 isotope.

In step (S33), the entire catalyst layer 230 is heated to a first temperature $T_1$ by the heating device (not shown) in the reaction furnace 222. Meanwhile, a first reaction area of the surface of the catalyst layer 230 can be heated by a laser heating devices 240 until a second temperature $T_2$ is reached, and a second reaction area of the other surface of catalyst layer 230 can be heated by another laser heating device 240 until a third temperature $T_3$ is reached. The first temperature $T_1$ is in a range from about 600° C. to about 650° C., the second temperature $T_2$ is in a range from about 650° C. to about 800° C., and the third temperature $T_3$ is in a range from about 850° C. to about 1100° C. After a given time, the carbon nanotube array 30 is formed.

Because the second temperature $T_2$ reaches the decomposition temperature of acetylene and ethylene, the acetylene including a single carbon-12 isotope and the ethylene including a single carbon-13 isotope will decompose together, to grow the second isotope-doped carbon nanotube sub-array 34 on the first reaction area of the catalyst layer 230. The third temperature $T_3$ reaches the decomposition temperature of methane, acetylene, and ethylene, therefore, the methane including a single carbon-14 isotope, the acetylene including a single carbon-12 isotope, and the ethylene including a single carbon-13 isotope will decompose together, to grow the third isotope-doped carbon nanotube sub-array 36 on the second reaction area of the catalyst layer 230. Because the first temperature $T_1$ only reaches the decomposition temperature of acetylene, the acetylene including a single carbon-12 isotope will decompose individually, to grow the first isotope-doped carbon nanotube sub-array 32 on the other areas of the catalyst layer 230.

Figure 11:
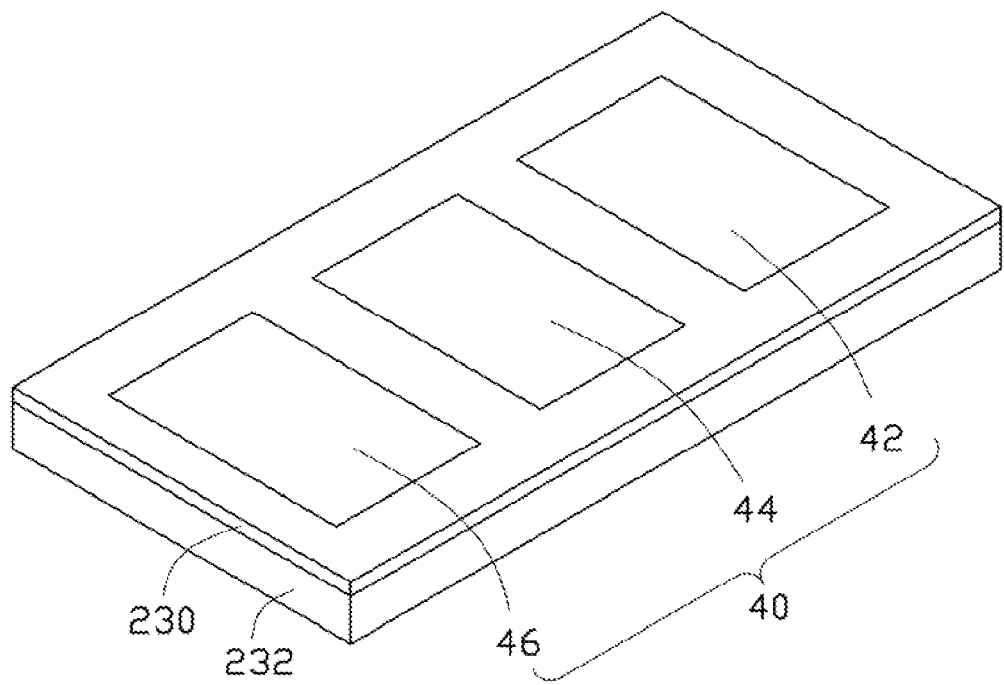
FIG. 11 shows one embodiment of a carbon nanotube array.

Referring to FIG. 11, a carbon nanotube array 40 is disclosed. The carbon nanotube array 40 can be formed on a catalyst layer 230 of the substrate 232. The carbon nanotube array 40 includes a first isotope-doped carbon nanotube sub-array 42, a second isotope-doped carbon nanotube sub-array 44 and a third isotope-doped carbon nanotube sub-array 46. Each isotope-doped carbon nanotube sub-array includes a plurality of carbon nanotubes. Each carbon nanotube in each isotope-doped carbon nanotube sub-array is made up of a single carbon nanotube segment. The carbon nanotubes of the first isotope-doped carbon nanotube sub-array 42 are composed of carbon-12 isotope. The carbon nanotubes of the second isotope-doped carbon nanotube sub-array 44 are composed of carbon-12 isotope and carbon-13 isotope. The carbon nanotubes of the third isotope-doped carbon nanotube sub-array 46 are composed of carbon-12 isotope, carbon-13 isotope, and carbon-14 isotope. The carbon-12 isotope and carbon-13 isotope in the carbon nanotubes of the second isotope-doped carbon nanotube sub-array 44 are mixed uniformly at any proportion. The carbon-12 isotope, carbon-13 isotope, and carbon-14 isotope in the carbon nanotubes of third isotope-doped carbon nanotube sub-array 46 are also mixed uniformly in any proportion.

The first isotope-doped carbon nanotube sub-array 42, the second isotope-doped carbon nanotube sub-array 44, and the third isotope-doped carbon nanotube sub-array 46 are located on the surface of the substrate, and spaced from each other. The first isotope-doped carbon nanotube sub-array 42, the second isotope-doped carbon nanotube sub-array 44, and the third isotope-doped carbon nanotube sub-array 46 can have the same shape and size. Alternatively, depending on the application, the size of the isotope-doped carbon nanotube sub-array can be different, and the shape of the isotope-doped carbon nanotube sub-array can be square, round, oval, rectangle, or other geometric shapes.

Figure 12:
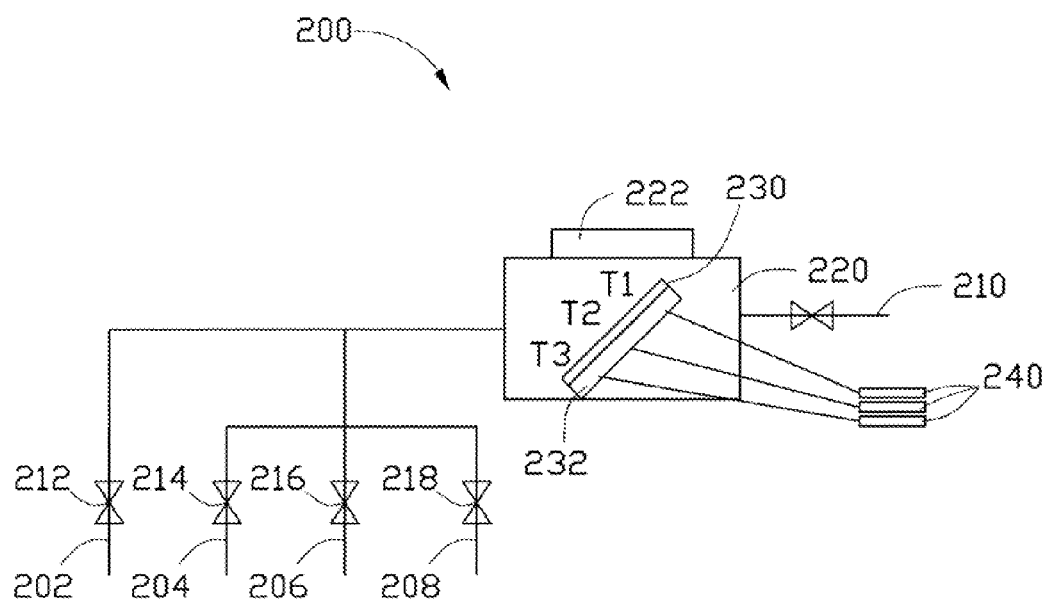
FIG. 12 shows a schematic diagram of one embodiment of an apparatus used to form the carbon nanotube array of FIG. 11.

Referring to FIG. 12, the carbon nanotube array 40 can be made by the following steps:

(S40) providing a substrate 232 with a catalyst layer 230 on a surface of the substrate 232, and placing the substrate 232 into a reaction device 200;

(S41) supplying three kinds of carbon source gases, wherein the carbon element in each carbon source gas includes a single carbon isotope;

(S42) introducing the three kinds of carbon source gases into the reaction device 200 simultaneously; and (S43) controlling the different areas of the catalyst layer 230 to achieve different reaction temperatures to grow the carbon nanotube array 40 on a surface of the catalyst layer 230.

The step (S40), step (S41), and step (S42) are substantially the same as the step (S30), step (S31), and step (S32), except that three laser heating devices 240 are provided for heating the reaction chamber 220 and the catalyst layer 230. The three laser heating devices 240 can irradiate different areas of the surfaces of the substrate 232, and the laser energy can pass through the substrate 232 and indirectly heat the corresponding reaction areas of the catalyst layer 230 to achieve different temperatures. Heating the catalyst layer 230 indirectly can prevent the growth of carbon nanotubes from damage by the irradiation of the laser heating devices 240.

In step (S43), a first laser heating device 240 irradiates a first area of the substrate 232, and the laser energy passes through the substrate 232 and heats a corresponding first reaction area of the catalyst layer 230 to achieve a first temperature $T_1$. Simultaneously, a second laser heating device 240 irradiates a second area of the substrate 232, and the laser energy passes through the substrate 232 and heats a corresponding second reaction area of the catalyst layer 230 to achieve a second temperature $T_2$. At the same time, a third laser heating device 240 irradiates a third area of the substrate 232, and the laser energy passes through the substrate 232 and heats a corresponding third reaction area of the catalyst layer 230 to achieve a third temperature $T_3$. The first temperature $T_1$ is in a range from about 600° C. to about 650° C., the second temperature $T_2$ is in a range from about 650° C. to about 800° C., and the third temperature $T_3$ is in a range from about 850° C. to about 1100° C. After a given time, the carbon nanotube array 40 is formed on the surface of the catalyst layer 230.

It is noted that because the first temperature $T_1$ only reaches the decomposition temperature of acetylene, the acetylene including a single carbon-12 isotope will decompose by itself to grow the first isotope-doped carbon nanotube sub-array 42 on the first reaction area of the catalyst layer 230. When the second temperature $T_2$ reaches the decomposition temperature of acetylene and ethylene, the acetylene including a single carbon-12 isotope and the ethylene including a single carbon-13 isotope will decompose together to grow the second isotope-doped carbon nanotube sub-array 44 on the second reaction area of the catalyst layer 230. When the third temperature $T_3$ reaches the decomposition temperature of methane, acetylene, and ethylene, the methane including a single carbon-14 isotope, the acetylene including a single carbon-12 isotope and the ethylene including a single carbon-13 isotope will decompose together, to grow the third isotope-doped carbon nanotube sub-array 46 on the third reaction area of the catalyst layer 230. Because the temperature of the other area of the catalyst layer 230 is lower than the decomposition temperature of methane, acetylene, and ethylene, there is no carbon source gas decomposed on other area of the catalyst layer 230, and no carbon nanotubes formed on the other area of the catalyst layer 230.

Furthermore, the temperatures of the first, second, and third reaction area of the catalyst layer 230 can be adjusted by the laser heating device 240 to achieve different temperatures to grow carbon nanotubes with a plurality of carbon nanotube segments in the carbon nanotube sub-array.

The method for making the carbon nanotube array has at least the following advantages. First, various kinds of isotope-doped carbon nanotubes having various kinds of carbon nanotube segments can be prepared easily by controlling the reaction temperature of different carbon hydrogen compounds. Second, it is convenient to control the different temperatures of the catalyst layer and make the different carbon source gases react under different temperatures, therefore, growing various kinds of isotope-doped carbon nanotubes on the catalyst layer. And the reaction mechanism of carbon hydrogen compounds to prepare carbon nanotubes can be further studied.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for forming a carbon nanotube array, the method comprising:
    (a) providing a substrate with a catalyst layer on a surface of the substrate, and placing the substrate into a reaction chamber;
    (b) supplying at least two kinds of carbon source gases, each carbon source gas comprising a different single carbon isotope;
    (c) introducing the at least two kinds of carbon source gases into the reaction chamber simultaneously; and
    (d) controlling the reaction chamber to different reaction temperatures to react the at least two kinds of carbon source gases under different temperatures and grow a carbon nanotube array on a surface of the catalyst layer.

2. The method of claim 1, wherein the catalyst layer is selected from the group consisting of iron, copper, cobalt, nickel, and any alloy thereof.

3. The method of claim 1, wherein the at least two kinds of carbon source gases are hydrocarbons.

4. The method of claim 3, wherein the hydrocarbons are selected from the group consisting of methane, acetylene, ethylene, and allene.

5. The method of claim 1, wherein the step (b) further comprises steps of:
    evacuating the reaction chamber; and
    introducing a protective gas.

6. The method of claim 5, wherein the protective gas is selected from the group consisting of argon, nitrogen, helium, and neon.

7. The method of claim 1, wherein the carbon isotope is selected from the group consisting of carbon-12 isotope, carbon-13 isotope, and carbon-14 isotope.

8. The method of claim 1, wherein a reaction furnace or at least one laser heating device is used to control the reaction temperatures of the reaction device.

9. The method of claim 1, wherein the at least two kinds of carbon source gases comprise a first carbon source gas and a second carbon source gas, and the step (d) comprises the steps of:
controlling the reaction chamber to achieve a first temperature to react the first carbon source gas individually under the first temperature and grow a first carbon nanotube segment on the catalyst layer;
controlling the reaction chamber to achieve a second temperature to react the first and second carbon source gases together under the second temperature and grow a second carbon nanotube segment at a bottom of the first carbon nanotube segment.

10. The method of claim 9, wherein the first carbon source gas is acetylene comprising a single carbon-12 isotope, and the second carbon source gas is ethylene comprising a single carbon-13 isotope.

11. The method of claim 10, wherein the first temperature is in a range from about 600° C. to about 650° C., and the second temperature is in a range from about 650° C. to about 800° C.

12. The method of claim 1, wherein the at least two kinds of carbon source gases comprise a first carbon source gas and a second carbon source gas, and the step (d) comprises the steps of:
controlling the reaction chamber to achieve a first temperature to react the first and second carbon source gases together under the first temperature and grow a first carbon nanotube segment on the catalyst layer;
controlling the reaction chamber to achieve a second temperature to react the first carbon source gases individually under the second temperature and grow a second carbon nanotube segment at a bottom of the first carbon nanotube segment.

13. The method of claim 1, wherein the at least two kinds of carbon source gases comprise a first carbon source gas, a second carbon source gas, and a third carbon source gas, and the carbon isotopes of the first, second, and third carbon source gases are different from each other.

14. The method of claim 13, wherein the step (d) comprises the steps of:
controlling the reaction chamber to achieve a first temperature to react the first carbon source gas individually under the first temperature and grow a first carbon nanotube segment on the catalyst layer;
controlling the reaction chamber to achieve a second temperature to react the first and second carbon source gases together under the second temperature and grow a second carbon nanotube segment at a bottom of the first carbon nanotube segment; and
controlling the reaction chamber to achieve a third temperature to react the first, second, and third carbon source gases together under the third temperature and grow a third carbon nanotube segment at a bottom of the second carbon nanotube segment.

15. The method of claim 14, wherein the first carbon source gas is acetylene comprising a single carbon-12 isotope, the second carbon source gas carbon source gases is ethylene comprising a single carbon-13 isotope, and the third carbon source gas is methane comprising a single carbon-14 isotope.

16. The method of claim 15, wherein the first temperature is in a range from about 600° C. to about 650° C., the second temperature is in a range from about 650° C. to about 800° C., and the third temperature is in a range from about 850° C. to about 1100° C.

17. A method for forming a carbon nanotube array, the method comprising:
(a) providing a substrate with a catalyst layer on a surface of the substrate, and placing the substrate into a reaction chamber;
(b) controlling the reaction chamber to a reaction temperature;
(c) introducing a first carbon source gas into the reaction chamber to grow a first carbon nanotube segment, wherein the first carbon source gas comprises a single carbon isotope; and
(d) introducing a second carbon source gas with the first carbon source gas into the reaction chamber to grow a second carbon nanotube segment at a bottom of the first carbon nanotube segment, wherein the second carbon source gas and the first carbon source gas are selected from the group consisting of methane, acetylene, ethylene, and allene; the second carbon source gas comprises a hydrocarbon that is different from the hydrocarbon of the first carbon source gas; and the second carbon source gas comprises a single carbon isotope different from the carbon isotope of the first carbon source gas.

18. The method of claim 17, wherein the first carbon source gas has a first decomposition temperature, the second carbon source gas has a second decomposition temperature, and the reaction temperature is equal to or larger than any one of the first and second decomposition temperature.

19. The method of claim 17, wherein the first carbon source gas is acetylene comprising a single carbon-12 isotope, and the second carbon source gas is ethylene comprising a single carbon-13 isotope.

20. The method of claim 19, wherein the reaction temperature is in a range from about 650° C. to about 800° C.

* * * * *